United States Patent [19]

Vignola

[11] Patent Number: 5,895,531
[45] Date of Patent: Apr. 20, 1999

[54] APPARATUS AND POLYMERIZATION GUN FOR COATING OBJECTS BY VACUUM DEPOSIT

[75] Inventor: Richard Vignola, deceased, late of Sarasota, Fla., by Gail Vignola, executrix

[73] Assignee: CompuVac Systems, Inc., Sarasota, Fla.

[21] Appl. No.: 08/764,196

[22] Filed: Dec. 13, 1996

[51] Int. Cl.$^6$ ...................................... H05H 1/00
[52] U.S. Cl. .................. 118/723 VE; 118/723 ER; 204/298.05
[58] Field of Search ............ 118/723 VE, 723 EB, 118/723 ER, 730; 204/298.05

[56] References Cited

U.S. PATENT DOCUMENTS 4,842,893 6/1989 Yializis et al. ........................... 118/730
5,656,141 8/1997 Betz et al. ........................... 204/298.05

Primary Examiner—Thi Dang
Attorney, Agent, or Firm—Charles J. Prescott

[57] ABSTRACT

An apparatus for initial ion cleaning, vapor metal deposition and protective coating of objects by vacuum deposition. The apparatus includes a vacuum chamber for receiving the objects which are held on a movable rack or support. A metal such as aluminum is vaporized centrally in the chamber in a well known fashion after the chamber has been substantially evacuated of air molecules for uniform vapor deposition of the metal atop exposed surfaces of the objects. A polymerization gun includes an elongated housing which is connected to an external surface of the chamber over an elongated opening formed through a chamber side wall. The polymerization gun also includes an elongated conductive preferably aluminum rod disposed along the opening and two apertured delivery tubes or members positioned within the housing. The conductive rod is electrically isolated from the housing and chamber and connected to a d.c. or a.c. high voltage power source as a cathode to produce plasma during ion cleaning and when applying the protective monomer coating. By positioning the two delivery tubes in close proximity to the conductive rod, both inert gas used for ion cleaning and a liquid monomer which is vaporized as it is drawn into the housing by chamber vacuum must each in proper sequence pass through the plasma before entering the chamber to enhance uniformity of cleaning, deposition and polymerization of the protective coating of the objects.

9 Claims, 6 Drawing Sheets

APPARATUS AND POLYMERIZATION GUN FOR COATING OBJECTS BY VACUUM DEPOSIT

BACKGROUND OF THE INVENTION

1. Scope of Invention

This invention relates generally to systems for coating objects by vacuum deposition, and more particularly to such a system having a uniquely configured plasma producing gun and protective vapor deposited coating arrangement.

2. Prior Art

Vacuum deposition of vaporized metal and plasma-energized protective coatings onto the exterior and interior surfaces of objects such as plastic components for automobile manufacturers which require a high degree of uniformity and finish quality are well known. One major manufacturer of such equipment is F. J. Stokes Corporation.

These prior art vacuum deposition systems typically include a medium to large sized vacuum chamber, a large moveable rack or carriage for holding and supporting a plurality of objects for coating within the chamber, means for conveniently moving the loaded object support carriage into and out of the chamber, an arrangement for producing vaporized metal for depositing a first metallic layer of vaporized metal onto the surface of the objects and a source of vaporized protective liquid such as a monomer which is applied atop the vaporized metal first deposited onto the surfaces of the objects within the vacuum chamber.

The use of a plasma created within the vacuum chamber in the vicinity of the metal coated objects is also typically utilized to energize the vaporized liquid monomer and to accelerate the liquid monomer within the vacuum chamber to facilitate a uniform protective coating applied to the objects.

A shortcoming with respect to the plasma coating technique for energizing and applying the liquid monomer is with respect to the placement of the discharge or spray bar utilized to disperse the vaporized monomer into the vacuum chamber. Typically, the monomer discharge is within a lower portion of the vacuum chamber while the plasma source is positioned in another location within the vacuum chamber whereby the vaporized liquid monomer entering the vacuum chamber must first be drawn toward the plasma and then energized and dispersed throughout the vacuum chamber. This arrangement leads to premature, undercured and non-uniform deposition of the liquid monomer onto the metal coated surfaces of the objects before being fully energized by the plasma condition created for that purpose within the vacuum chamber.

Applicant is aware of a number of patented prior art systems which are listed below which typically represent the state of the art in vacuum deposition.

| | |
|---|---|
| 3,086,889 | Strong |
| 3,097,113 | Welsh |
| 3,117,887 | Shepard, et al. |
| 3,518,108 | Heiss, Jr., et al. |
| 3,524,426 | Ogle, et al. |
| 3,641,973 | Shrader |
| 3,713,869 | Geffeken, et al. |
| 3,970,820 | Mahl |
| 4,173,944 | Koppl, et al. |
| 4,338,883 | Mahler |
| 4,447,374 | Tanaka |
| 4,478,174 | Ranger |

-continued

| | |
|---|---|
| 4,673,588 | Bringmann, et al. |
| 4,687,679 | Beale |
| 4,863,756 | Hartig, et al. |
| 5,053,243 | Schuurmans, et al. |
| 5,182,000 | Antonelli, et al. |
| 5,217,749 | Denton, et al. |
| 5,312,529 | Antonelli, et al. |
| 5,340,628 | Tanisaki, et al. |
| 5,401,541 | Hodnett, III |
| 5,538,909 | Poliquin, et al. |
| 5,560,963 | Tisack |

However, for the most part, these prior art references are of limited scope and of a specialty nature, some of which utilize metal vaporizing boats for vacuum deposition of a metallic film. A portion of these references also do not depend upon or require the plasma atmosphere within the vacuum chamber in a fashion similar to that of the present invention.

BRIEF SUMMARY OF THE INVENTION

This invention is directed to an apparatus for initial plasma ion cleaning, metal vapor deposition and plasma enhanced protective coating of objects by vacuum deposition. The apparatus includes a vacuum chamber for receiving the objects which are held on a movable rack or support. A metal such as aluminum, chromium, or nickel-chromium, etc. is vaporized centrally in the chamber in a well known fashion after the chamber has been substantially evacuated of air molecules for uniform vapor deposition of the metal atop exposed surfaces of the objects. A polymerization gun includes an elongated housing which is connected to an external surface of the chamber over an elongated opening formed through a chamber side wall. The polymerization gun also includes an elongated conductive preferably aluminum rod disposed along the opening and two apertured delivery tubes or members positioned within the housing. The conductive rod is electrically isolated from the housing and chamber and connected to a d.c. or a.c. or R.F. or microwave high voltage power source as a cathode to produce plasma during ion cleaning and during the protective polymer deposition. By positioning the two delivery tubes (with multiple spaced small gas openings) in close proximity to the conductive rod, both inert vapor used for ion cleaning and a liquid monomer which is vaporized as it is drawn into the housing by chamber vacuum must (each in proper sequence) pass through the plasma before entering the chamber to enhance uniformity of cleaning, deposition and polymerization of the protective coating of the objects.

It is therefore an object of this invention to provide an apparatus for protectively coating previously vapor metallize coated objects within a vacuum chamber, the protective monomer coating having more uniform and more fully polymerized properties.

It is still another object of this invention to provide an apparatus for initial ion cleaning, vapor metal deposition and then protective coating of objects within a vacuum chamber by vacuum deposition during a single vacuum draw down procedure.

It is yet another object of this invention to provide a uniquely configured and positioned polymerization gun positioned within a side cavity formed into a wall area of the vacuum chamber so as to enhance vapor deposition and polymerization of a liquid monomer atop the exposed surfaces of objects within the vacuum chamber.

In accordance with these and other objects which will become apparent hereinafter, the instant invention will now be described with reference to the accompanying drawings.

DETAILED DESCRIPTION OF THE INVENTION

Figure 1:
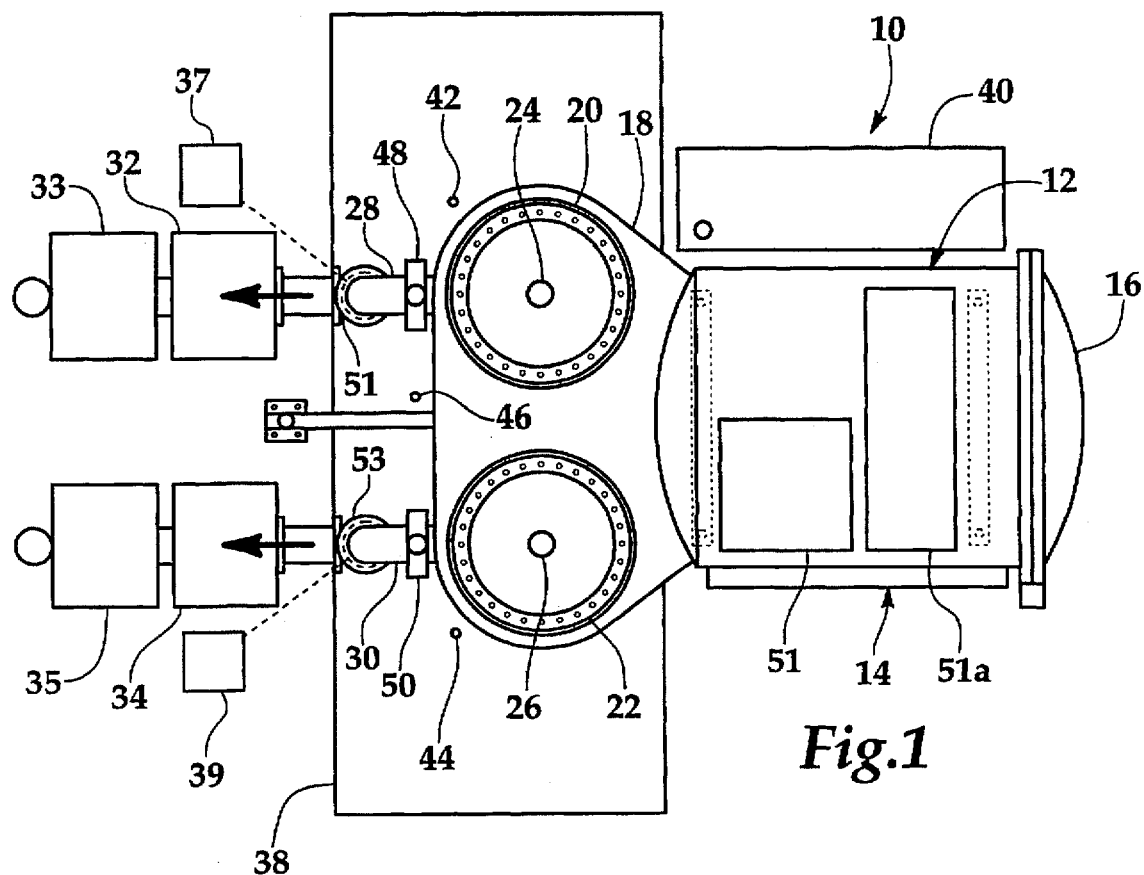
FIG. 1 is a top plan simplified schematic view of the entire apparatus of the present invention.
Figure 2:
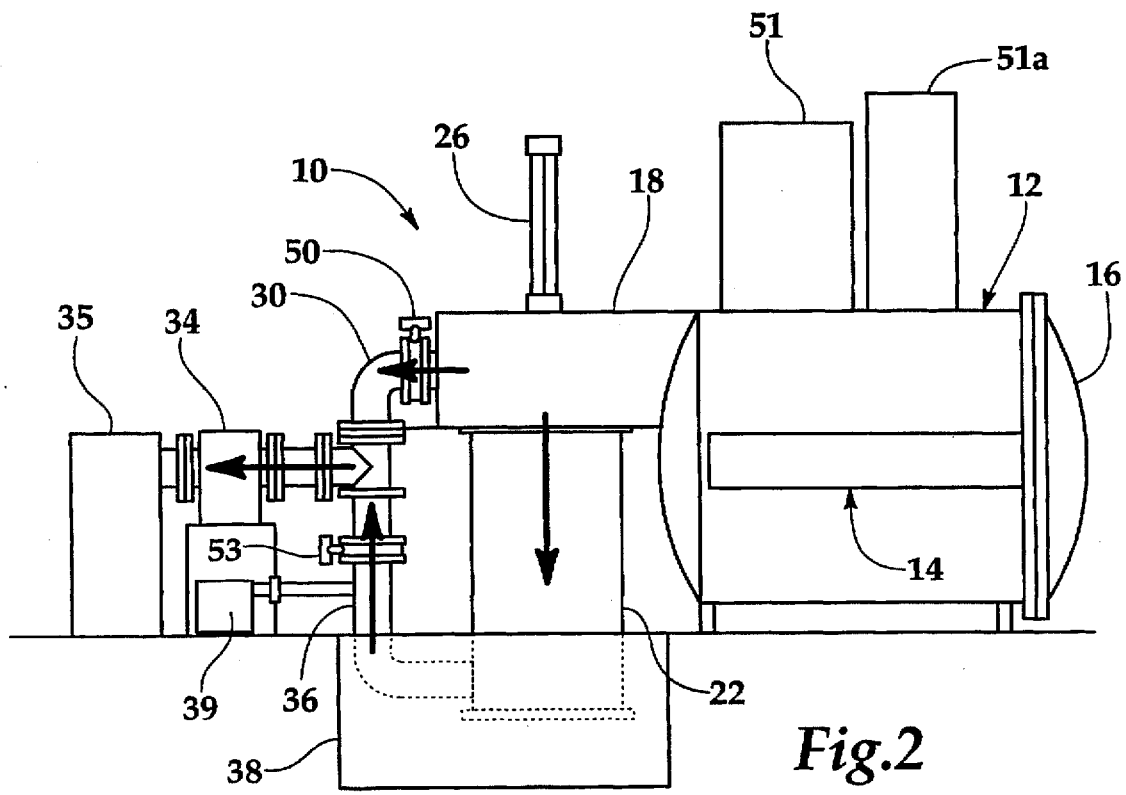
FIG. 2 is a side elevation view of FIG. 1.
Figure 3:
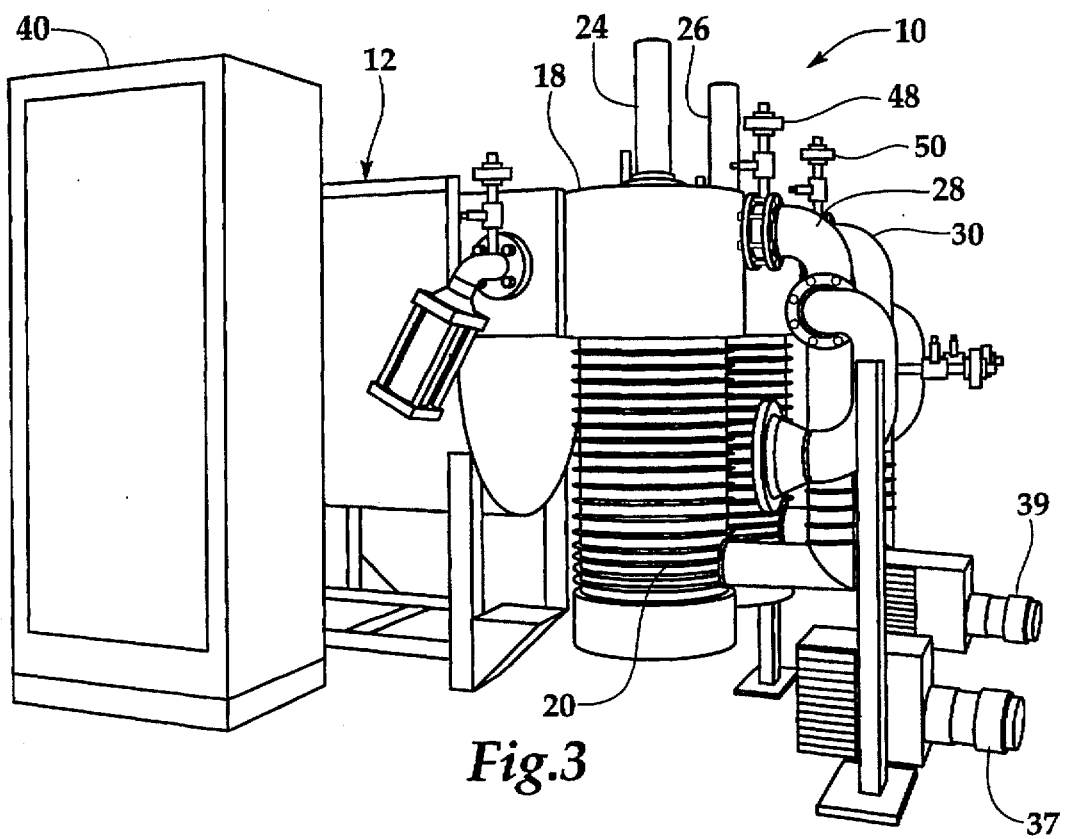
FIG. 3 is a perspective view of FIG. 1 absent some components for clarity.

Referring now to the drawings, and particularly to FIGS. 1 to 3, the apparatus of the present invention is shown generally at numeral 10 and includes a vacuum chamber 12 having a polymerization gun assembly 14 in accordance with the present invention attached to a side of the vacuum chamber 12. The system 10 also includes a plenum 18 which extends horizontally from one end of the vacuum chamber 12. The plenum 18 is connected above dual water cooled diffusion pumps 20 and 22, preferably the Varian NHS-35" diffusion pumps. Hi-Vac cylinders 24 and 26 serve to open the diffusion pumps 20 and 22 which generally serve as a second stage of vacuum chamber 12 drawdown. Water coolant into the system is connected at 42 and 44, while an air supply for the system is connected at 46.

During the initial vacuum draw down stage, valves 48 and 50 are opened and the twin mechanical pumps 33 and 34 and blower pumps 32 and 34 provide a viscous flow for vacuum drawdown through manifolds 28 and 30. During the second stage of vacuum drawdown, valves 48 and 50 are closed and valves 51 and 53 are opened to allow the diffusion pumps 20 and 22 to provide molecular flow for final vacuum drawdown. The molecular flow produced by the diffusion pumps 20 and 22 flows through manifolds 36 discharging through pumps 33 and 35 and 32 and 34. A pit 38 is provided for receiving the lower portion of the diffusion pumps 20 and 22 so as to facilitate the horizontal orientation of the plenum chamber 18 for more advantageous evacuation of the vacuum chamber 12.

Holding pumps 37 and 39 are provided to protect the diffusion pumps 20 and 22 when the system 10 is open and idle. A polycold pump 51 by Polycold Systems International for evacuating water molecules from the vacuum chamber 12 is also provided. The firing transformer in housing 51a is required for vaporizing the sacrificial evaporant positioned in the center of the carriage (described herebelow). A control housing 40 contains the control circuitry and components required to sequentially operate the system 10.

Figure 4:
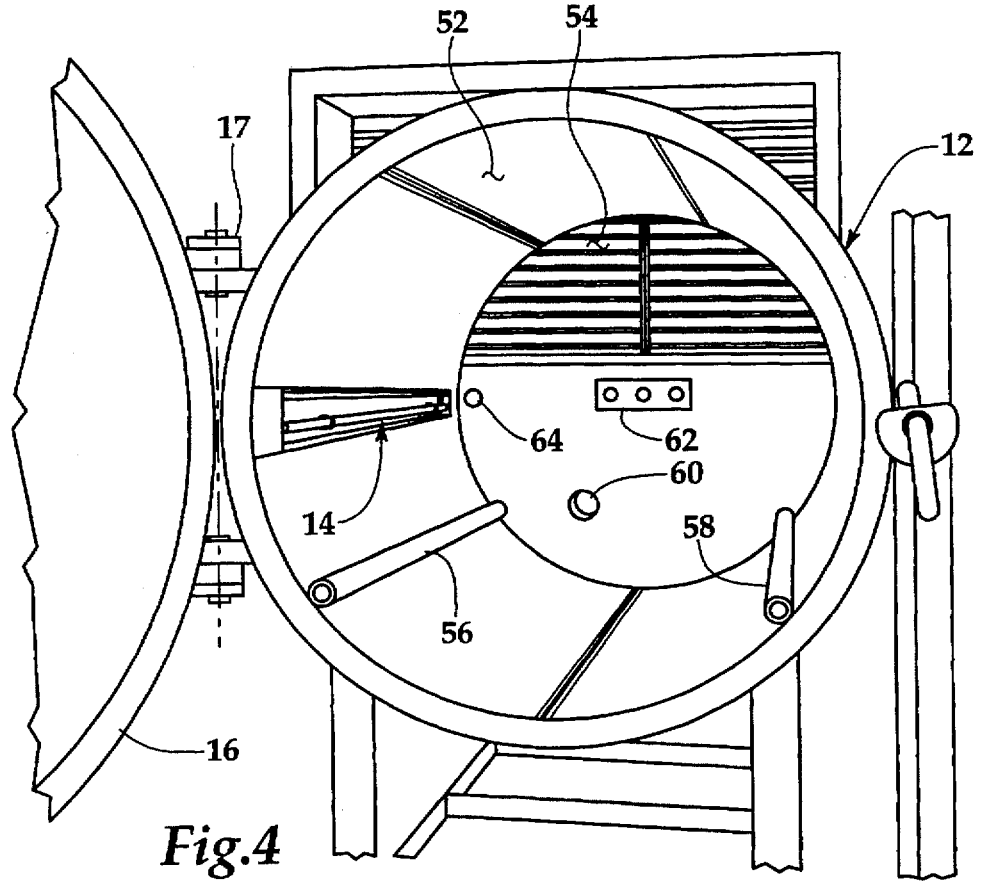
FIG. 4 is a perspective view of the vacuum chamber of FIG. 1 in an open, ready-to-load configuration.

Referring now to FIG. 4, many of the details of the vacuum chamber 12 are there shown and in subsequent figures described herebelow. The vacuum chamber 12 is generally constructed of mild steel having a diameter typically of 72" (but may range from 24", 48" to 72") and an overall chamber length of 82" (but may range from 36" to 104"). Panels of thin stainless steel shown typically at 52 line the inner cylindrical surface of the vacuum chamber 12 to prevent vaporized metal buildup and are easily replaceable for cleaning. The vacuum chamber 12 is evacuated through grill 54 which is in fluid communication with the plenum chamber 18 as previously described.

A mild steel dome-shaped door 16 pivotally connected at 17 to the one end of the vacuum chamber 12 is sealably closeable onto the open end of the vacuum chamber 12 and is also protectively covered by removable thin stainless steel panels and further includes one or two transparent viewing parts through which the vacuum deposition process may be observed.

Figure 5:
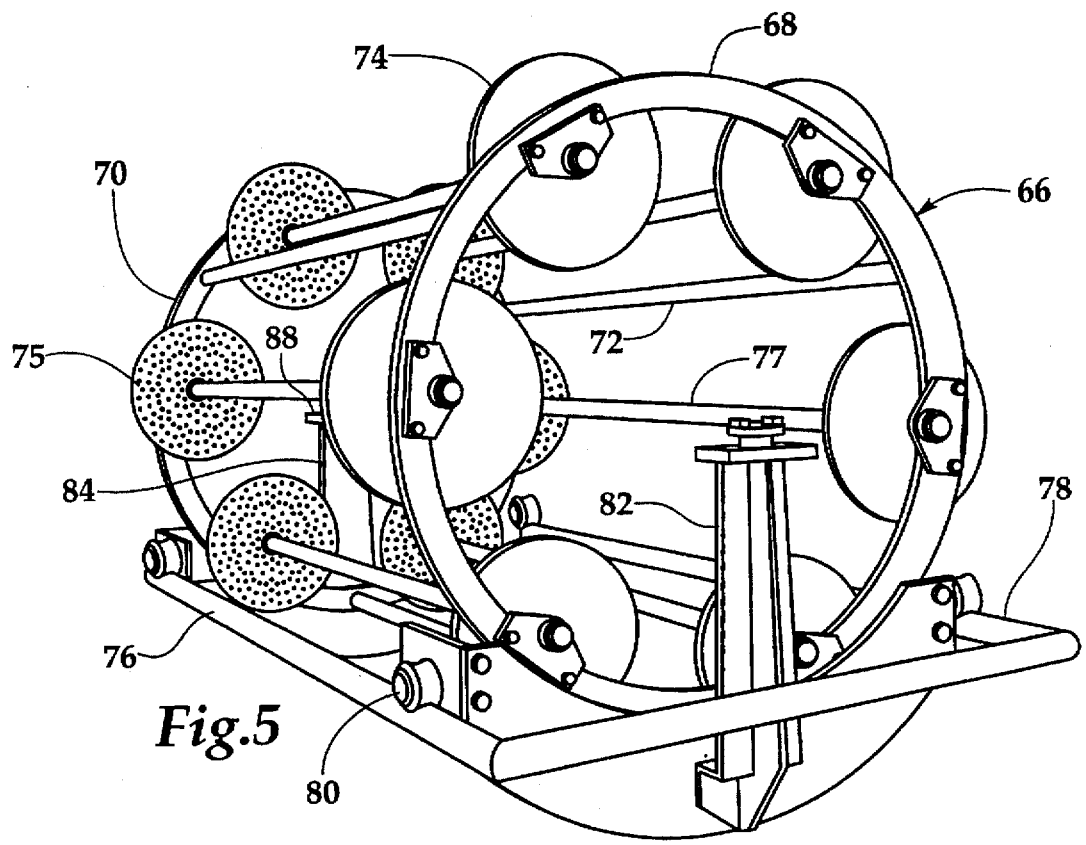
FIG. 5 is a perspective view of a planetary object support carriage for supporting objects to be loaded into and coated within the vacuum chamber.

The vacuum chamber 12 is adapted to include longitudinally extending parallel and generally horizontally oriented rails 56 and 58. These rails 56 and 58 are spaced apart and adapted to supportively rollably receive a carriage 66 as seen in FIG. 5. This carriage 66, including rollers 80 at each corner thereof rolling on support members 76 and 78 facilitate the easy deployment of the carriage 66 into and out of the vacuum chamber 12.

Figure 11:
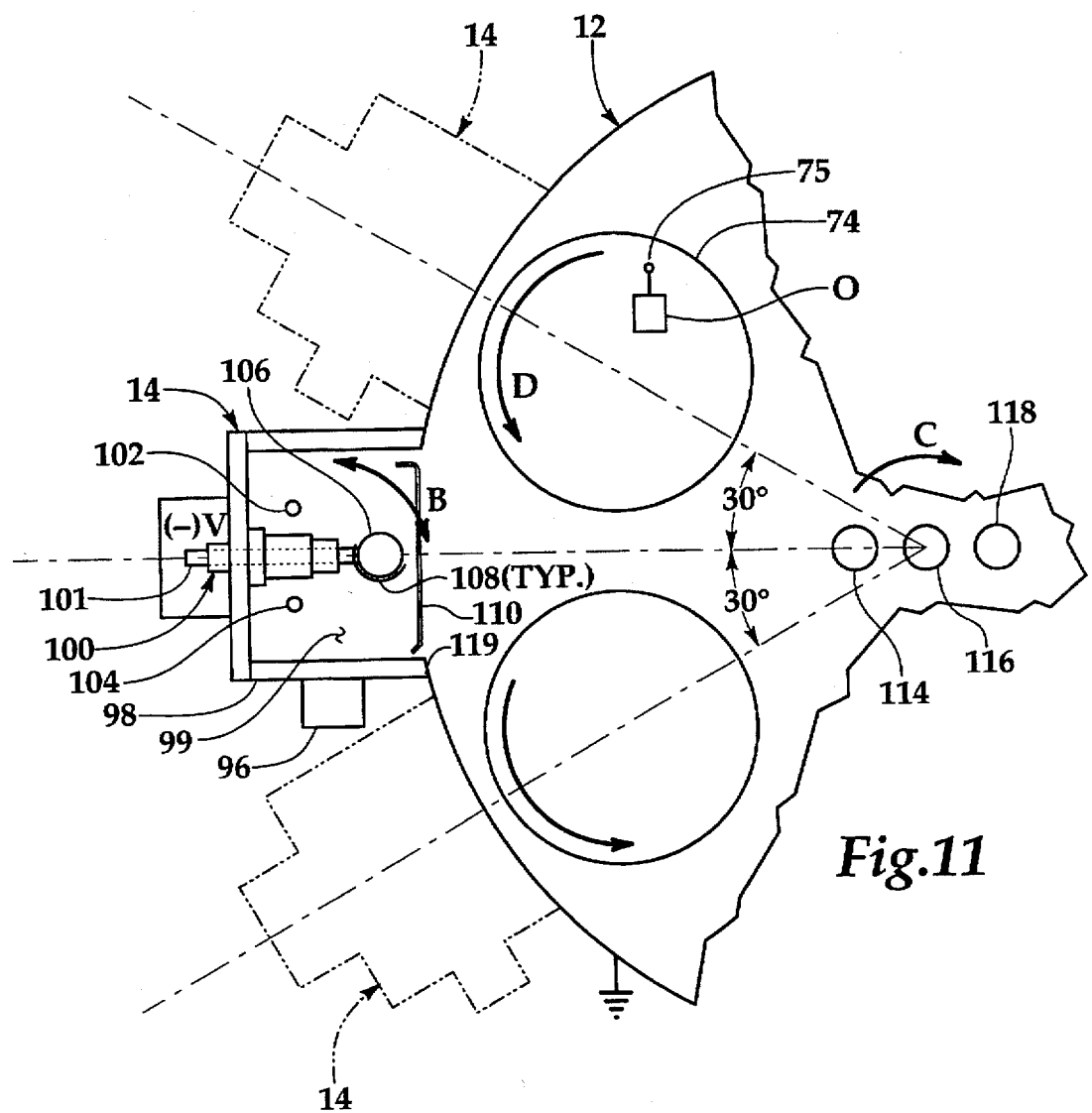
FIG. 11 is a front elevation simplified schematic view of the vacuum chamber and polymerization gun showing alternate positioning of a dual polymerization gun arrangement.

The carriage 66 includes a plurality of apertured reels 74 mounted for rotation on circular frame members 68 and 70, pairs of these reels being interconnected by a longitudinal connecting shaft 72. As best seen in FIG. 11, the circular frames 68 and 70 (not shown in FIG. 11) rotate in the direction of arrow C, while each of the pairs of reels 74 on shaft 77 rotate oppositely in the direction of arrows D.

By this arrangement, the carriage 66, using both longitudinal shafts 77 and the apertures provided in each of the reels 74, will supportively receive objects to be hung therefrom for vacuum deposition of coatings within the vacuum chamber.

Figure 12:
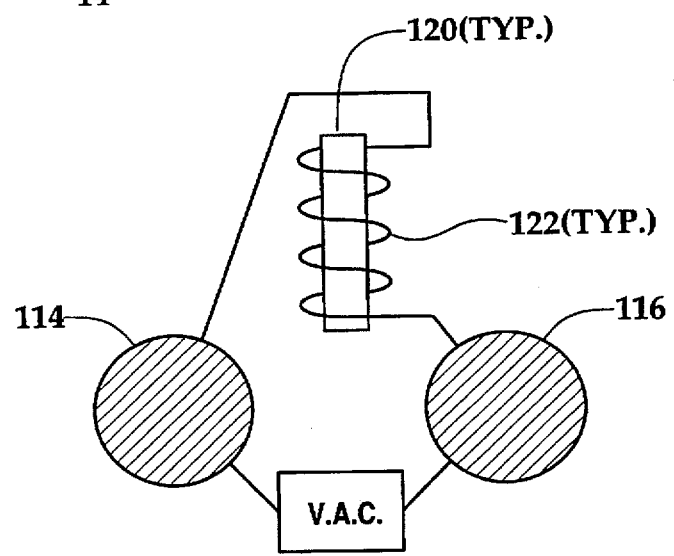
FIG. 12 is an enlarged view of the central portion of the planetary object carriage shown in FIG. 11 and depicting a typical metal vaporization arrangement.

The carriage 66 also includes upright supports 82 and 84 which include electrical contacts 88 to supportively receive one or more elongated solid copper conductive bars 114, 116 and 118 supported thereon and therebetween. These copper bars shown schematically at 114 and 116 in FIG. 12 serve to carry the current and voltage required to vaporize a plurality of small pieces of sacrificial aluminum canes shown typically at 120 held within tungsten coils 122. Typically, between ten and fifteen of these aluminum sacrificial canes 120 are positioned along the length and between the aluminum rods 114, 116 and 118 as required based upon the volume of vaporized aluminum required to coat all of the objects being hung from the carriage 66.

Upon positioning of the carriage 66 loaded with objects to be coated into the vacuum chamber 12, the ends of the rods 114 and 116 and, where required, a third copper rod 118 as shown in FIG. 11, automatically interconnect with electrode plate 62. By this arrangement, no additional electrical conduit or connectors or the like are required to make full electrical connection between the firing transformer housing 51a and the inductor rods 114, 116 and 118.

Figure 6:
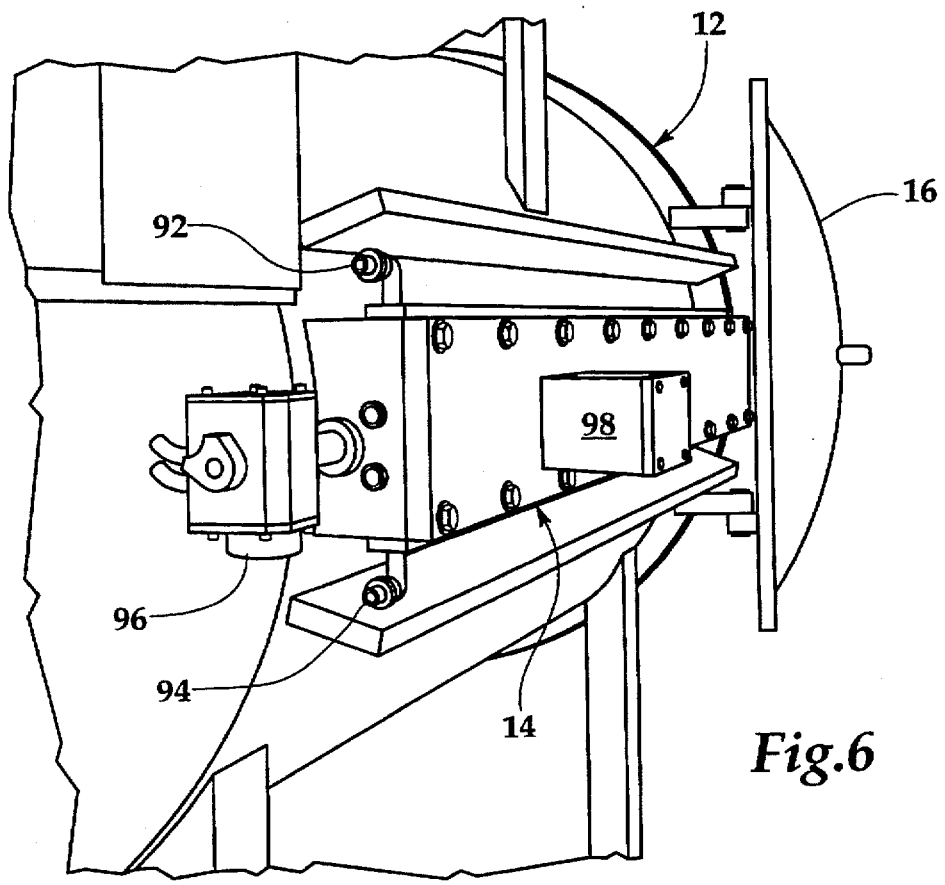
FIG. 6 is a perspective view of a polymerization gun as seen from the exterior of the vacuum chamber.
Figure 7:
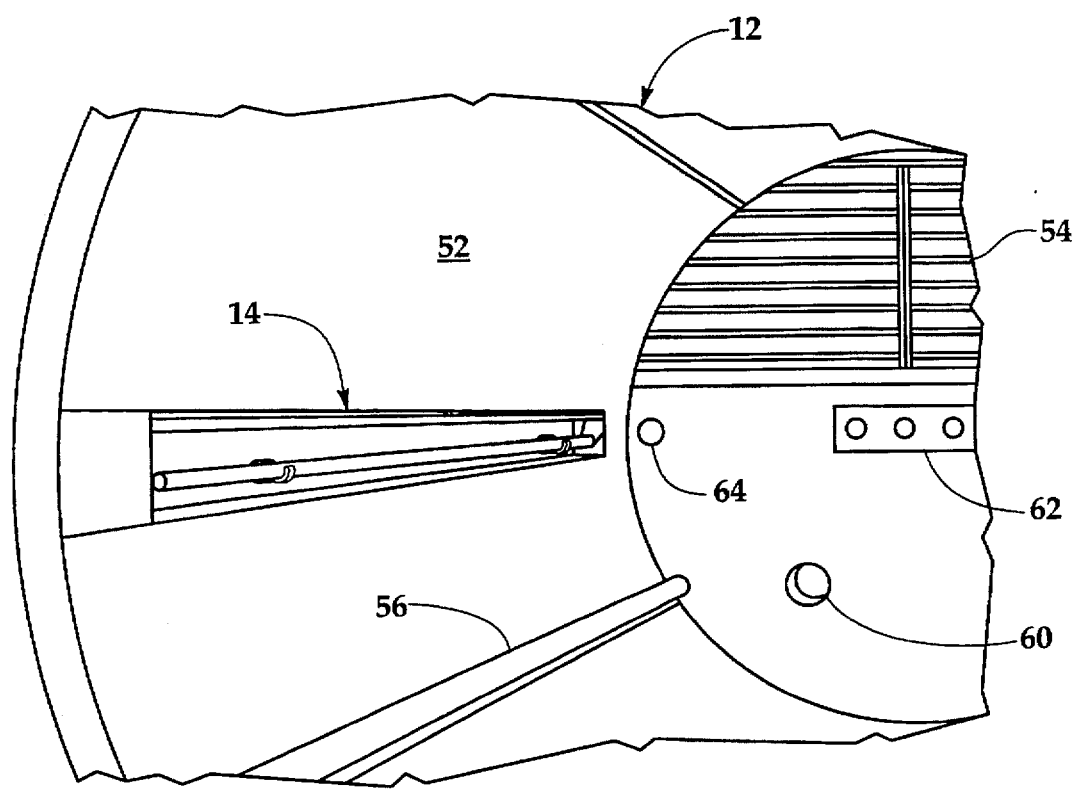
FIG. 7 is a perspective view of the polymerization gun in an open configuration as seen from the interior of the vacuum chamber.

A most important feature of the present invention is embodied in the polymerization gun assembly 14. As seen externally in FIG. 6 and from within the vacuum chamber in FIGS. 4 and 7 to 11, the polymerization gun 14 includes an external housing 98 formed of mild steel plate material which is connected externally around an opening 119 formed longitudinally in the side of the vacuum chamber 12. The housing 98, in combination with opening 119, thus form a cavity 99 in FIG. 11 for receiving the active components of the polymerization gun described herebelow.

Within the housing 98 of the polymerization gun 14 are positioned a longitudinally extending 1" diameter aluminum plasma conductor rod 106 supported within spaced conductive supports 108 (typ.) by which, in turn, are in electrical contact with, and supported by, a high current high voltage feedthru fitting 100. The source utilized for this feedthru fitting 100 is CHA Industries of Freemont, Calif. under P/N FT 58009. This feedthru fitting 100 is connected to the back surface of housing 98 as shown in FIG. 11, the insulated conductor 101 connected to a negative voltage source. The vacuum chamber 12 itself is grounded to the positive (+) side of this voltage source.

Figure 8:
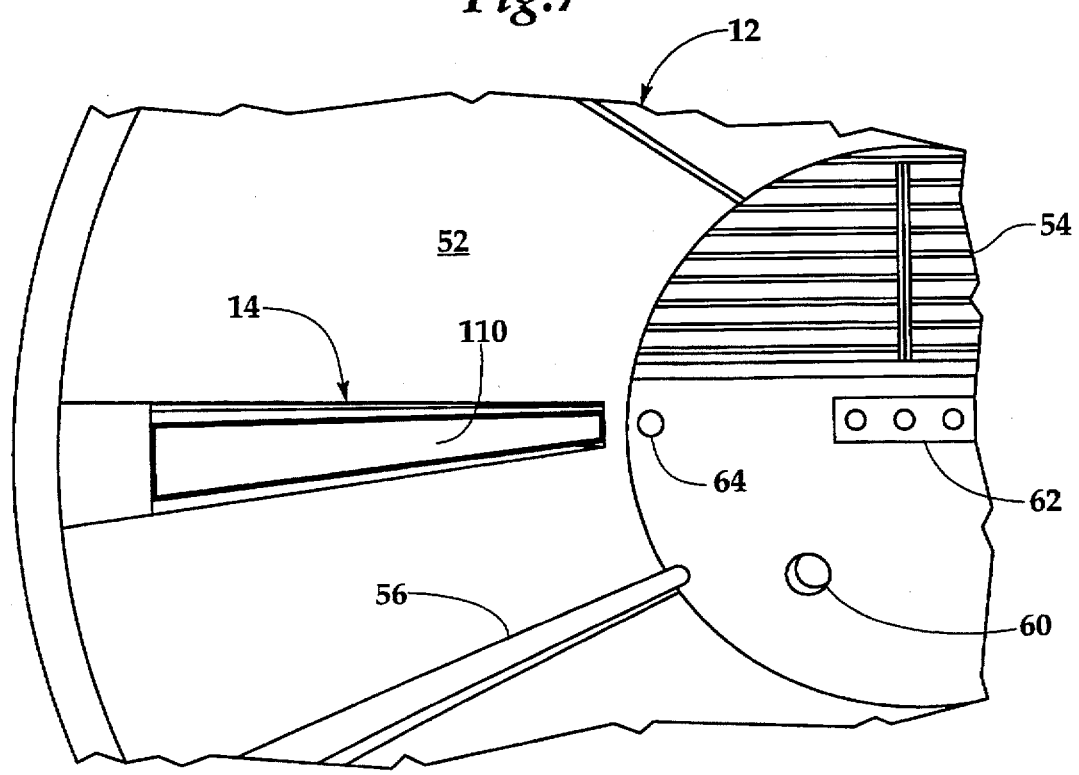
FIG. 8 is a view similar to FIG. 7 with the protective shield of the polymerization gun in a closed position.

As best seen in FIGS. 8 and 11, the cavity 99 is substantially closeable by a longitudinally extending shutter 110 which is movable from a closed position to an open position in the direction of arrows B by a shutter actuator 96. Thus, when shutter 110 is in the closed position shown in FIG. 11, the components within cavity 99 are substantially protected from the vaporized metal atmosphere described herebelow occurring with the vacuum chamber 12. Conductor rod 106 is also preferably wrapped with aluminum foil for added protection.

Figure 9:
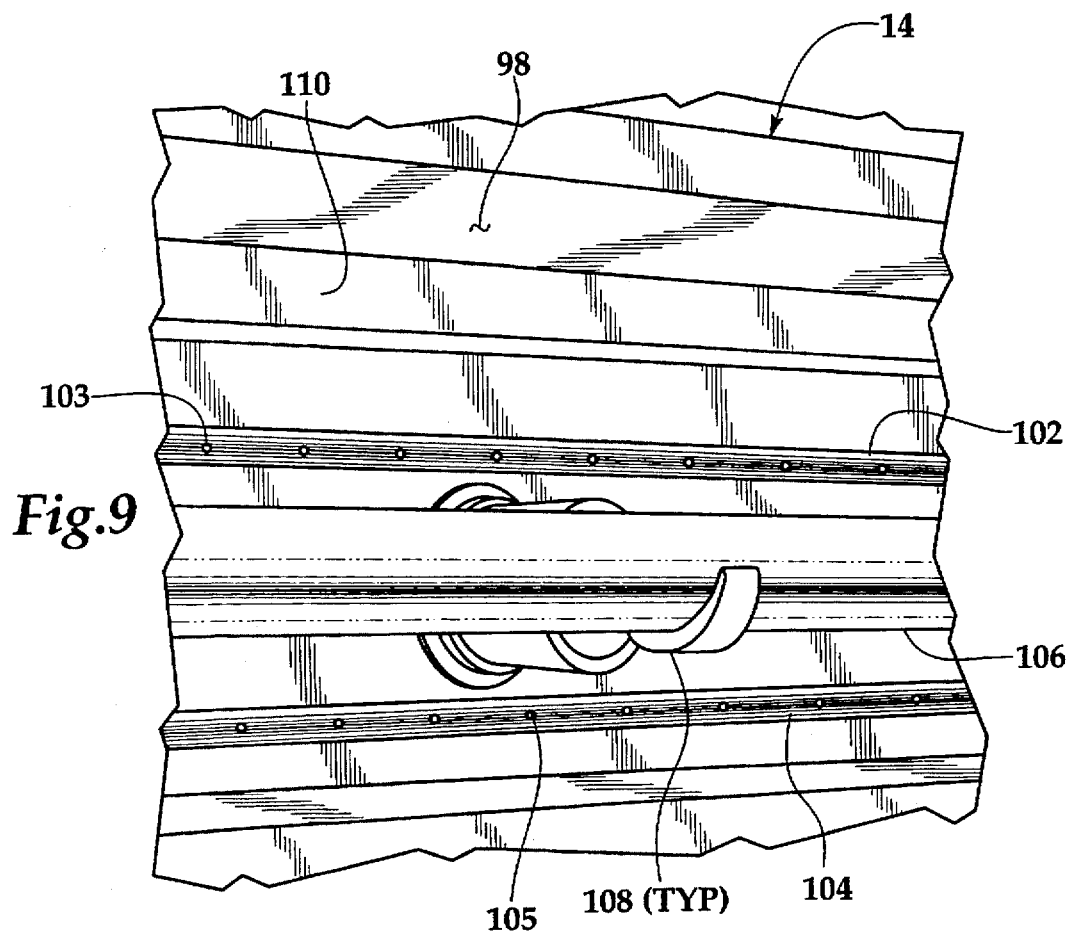
FIG. 9 is an enlarged view of a portion of the polymerization gun shown in FIG. 7.
Figure 10:
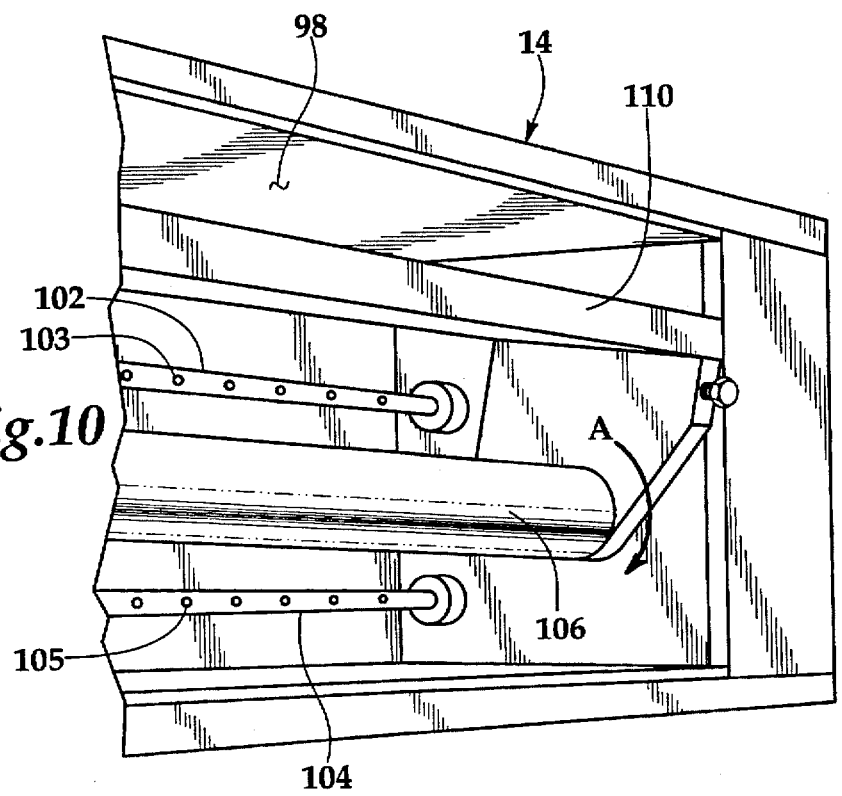
FIG. 10 is another view similar to FIG. 9.

As best seen in FIGS. 9, 10 and 11, the polymerization gun 14 also includes two longitudinally extending hollow fluid delivery tubes, a liquid monomer delivery tube 104 and typically an argon gas delivery tube 102. Each of these delivery tubes 102 and 104 include spaced apart apertures or nozzles 103 and 105, respectively for fluid discharge therefrom, the fluid being drawn from the nozzles 103 and 105 by the vacuum environment within the vacuum chamber 12 when occurring during each operation cycle.

Importantly note that the plasma rod 106 is positioned closer to the opening 118 than the liquid monomer and argon delivery tubes 104 and 102, respectively. This important relationship is established so that, when the shutter 110 is in the open position, and appropriate voltage and current are applied between the plasma conductor rod 106 and the vacuum chamber 12 itself, the plasma environment created surrounding the plasma rod 106 must first be penetrated by any vapor or gas discharging from either of these delivery tubes 102 or 104 (in proper sequence) before entering into the vacuum chamber itself.

A coating thickness monitor 64 is disposed at the end of the vacuum chamber 12 to monitor and control the uniform thickness of coatings being deposited upon the objects O positioned within the vacuum chamber 12. The preferred coating thickness monitor 64 sensing is supplied by Inficon, XTC-2 thickness controller. Utilizing a quartz crystal to sense the coating deposit rate and thickness, a feedback signal is provided to an external computer circuit to perform a closed loop control function of the evaporation.

CONTROL SYSTEM

An Allen Bradley SLC 501B microprocessor with analog input module for built-in vacuum gages includes analog input and output computer cards for all components along with a thermocouple card for temperature monitoring of pumps. Allen Bradley Panel View 550 touch screen allows access to all process functions at the touch of the screen.

Components are installed into the control panel 40 along with other appropriate control, alarm and warning signals in keeping with the strict stands for this type of system.

SEQUENCE OF OPERATION

The process of the present invention as above described includes three general steps as a preferred method of operation. After the carriage 66 has been loaded with the objects O to be coated and positioned within the vacuum chamber 12, the domed door 16 is sealingly closed and the vacuum pumping arrangement above described is then activated to substantially evacuate the air and water molecules within the vacuum chamber down to a residual air pressure of about $10^{-1}$ to $10^{-2}$ TORR.

ION DISCHARGE CLEANING

Voltage of approximately 2,000 volts is applied between the aluminum conductive rod 106 and the vacuum chamber 12 itself. This establishes a plasma glow discharge within the chamber 12 which emanates from the conductive rod 106. With the shutter 110 in the open position, a supply of typically argon gas is supplied at 92 in FIG. 6 and drawn into the argon discharge tube 103 which exits into the cavity 99 and passes into the vacuum chamber 12 through the plasma glow surrounding conductive rod 106. The argon is energized and absorbs energy from the plasma glow and the ionized argon is accelerated in all directions within the vacuum chamber 12 to strike the exterior surfaces of the objects O within the vacuum chamber 12 to effect surface ion cleaning. The process lasts approximately seventy seconds.

EVAPORATION PHASE

The vacuum level within the vacuum chamber 12 is reduced to down to a level of $10^{-4}$ to $10^{-6}$ TORR. At this point, a high current, low voltage potential is established between the reflective rods 114, 116 and 118 (optional) of about 15 V @ 3300 amps. This produces a direct resistance heating of the tungsten filaments shown typically at 122 in FIG. 12. The aluminum sacrificial canes 120 (typ.) are thus heated sufficiently to become vaporized at a temperature which significantly exceeds the vapor pressure in the chamber. Heated, metallized aluminum vapor is uniformly deposited onto the ion cleaned exterior surfaces of the objects O. This phase of the operation takes approximately 70 seconds. Note that shutter 110 is in the closed position so as to substantially prevent the vaporized aluminum from entering into cavity 99 and being deposited on any of the above-described components therein. Additionally, aluminum foil wrapping around conductive rod 106 prevents any build-up of the monomer on the conductive rod 106.

PROTECTIVE COATING

The vacuum chamber 12 is then adjusted in vacuum level back to approximately $10^{-2}$ TORR. The shutter 110 as placed in the open configuration, a high voltage low current potential between the conductive rod 112 and the vacuum chamber 12 is again applied to create a plasma glow emanating from conductive rod 106. A supply of liquid monomer of any siloxane family, but typically hexamethyl disiloxane, to be drawn through feed line 94 in FIG. 6 into the monomer discharge 104 and into cavity 99 as a vapor. This monomer vapor then passes through the plasma glow produced around conductive rod 106, the monomer vapor, being close to the plasma source, is strongly energized and crosslinked and finally deposited and polymerized onto the exterior surfaces of the metallized objects. This third phase of the production cycle lasts about 3 to 6 minutes.

Because the vaporized monomer must first pass through the plasma glow created by conductive rod 106 before entering the chamber 12 and before contact with any of the objects O within the vacuum chamber 12, a significantly more uniform and durable polymerization and protective coating thickness deposited onto the exterior metallized surfaces of the object O is achieved.

Referring again to FIG. 11, for enhanced and even more uniform deposit of polymerized monomer protective coating onto the exterior metallized surfaces of the objects O, two polymerization guns 14 (shown in phantom), spaced apart 60 degrees about the central longitudinal axis of the vacuum chamber 12 are preferred. This orientation is substantially equal to the angular spacing between adjacent reels 74 (typ.). Timing of rotation is such that, as all of the reels 74 are rotated as a unit in the direction of arrow C, while each reel 74 rotates approximately through 180 degrees in the direction of arrow D as it passes each of the two spaced polymerization guns 14. By this arrangement, objects hung on each of the reels 74 are exposed to a full revolution of monomer vapor emanating from each of the polymerization guns 14 as previously described.

While the instant invention has been shown and described herein in what are conceived to be the most practical and preferred embodiments, it is recognized that departures may be made therefrom within the scope of the invention, which is therefore not to be limited to the details disclosed herein, but is to be afforded the full scope of the claims so as to embrace any and all equivalent apparatus and articles.

What is claimed is:

1. An apparatus for coating objects by vacuum deposition comprising:

a vacuum chamber including an elongated cavity in vacuum communication with, and opening into said chamber through an elongated opening formed through a side wall of said chamber;

means for establishing a vacuum in said chamber;

means for supporting the objects within said chamber;

means for vaporizing a metal within said chamber when under vacuum for deposit onto substantially all exposed surfaces of the objects;

means positioned in said cavity for producing a plasma and for dispensing a liquid monomer which is drawn by chamber vacuum from an external supply as a vapor into said chamber whereby substantially all of said monomer vapor is directed to pass through said plasma before being uniformly deposited and polymerized atop the exposed surfaces of the objects which have previously been coated with said vaporized metal.

2. An apparatus for coating objects by vacuum deposition as set forth in claim 1, further comprising:

an elongated protective shutter sized substantially similar to a size of said opening, said shutter being movable to substantially close said opening whereby said means for producing plasma is substantially protected from vaporized metal deposits.

3. An apparatus for coating objects by vacuum deposition as set forth in claim 1, further comprising:

means also positioned in said cavity for ion cleaning the exterior surfaces of the objects before vapor deposition of metal thereon by dispensing an inert gas which is drawn by chamber vacuum from an external supply into said chamber whereby substantially all of said inert gas is directed to pass through said plasma to cleaningly bombard the exposed surfaces of the objects with ions.

4. An apparatus for applying a uniform metal coating onto objects followed by a uniform protective coating atop said metal coating, said apparatus comprising:

a vacuum chamber including an elongated cavity formed into a side wall of said chamber;

means for establishing a vacuum in said chamber, means for supporting the objects within said chamber, means for depositing a uniform metal vapor onto the objects;

a polymerizer gun positioned and connected substantially within said cavity including an elongated conductive bar electrically isolated from said chamber and an elongated monomer delivery member having spaced monomer dispensing apertures, said delivery member being spaced in close proximity to said conductive bar, said delivery member being in fluid communication with an external supply of a liquid monomer, said conductive bar being positioned between said delivery member and an opening of said cavity into said chamber whereby substantially all of said liquid monomer being drawn by vacuum into said chamber through said delivery member must first pass through a plasma produced by applying suitable direct current high electric potential between said conductive bar as a cathode and said chamber as an anode before being uniformly deposited and polymerized to form said protective coating.

5. An apparatus for coating objects by vacuum deposition as set forth in claim 4, further comprising:

an elongated protective shutter sized substantially similar to a size of said opening, said shutter being selectively movable to substantially close said opening whereby said polymerizer gun is substantially protected from vaporized metal deposits.

6. An apparatus for coating objects by vacuum deposition as set forth in claim 4, further comprising:

means also positioned in said cavity for ion cleaning the exterior surfaces of the objects before vapor deposition of metal thereon by dispensing an inert vapor which is drawn by chamber vacuum from an external supply into said chamber whereby substantially all of said inert vapor must pass through said plasma to cleaningly bombard the exposed surfaces of the objects with ions.

7. A polymerization gun for use with a vacuum chamber of an apparatus for protectively coating objects by vacuum deposition, said polymerization gun comprising:

an elongated housing connectable onto an outer surface of said chamber and sealable over an elongated opening formed through a side wall of said vacuum chamber, an elongated conductive bar supported in and generally coextensive with said housing, said conductive bar being electrically isolated from said chamber and said housing;

an elongated monomer delivery member also supported in said housing having spaced monomer dispensing apertures and being spaced in close proximity to said conductive bar;

said monomer delivery member being connectable with an external supply of a liquid monomer or polymer, said conductive bar being positioned between said monomer or polymer delivery member and said opening and in close proximity to said conductive bar whereby substantially all of the vapor monomer or polymer being drawn by a vacuum environment into said chamber must first pass through and be energized and ionized by a plasma before being deposited and polymerized to form said protective coating, said plasma being produced by applying a suitable current high electric potential between said conductive bar and said chamber.

8. A polymerization gun as set forth in claim 7, further comprising:

an elongated protective shutter sized substantially similar to a size of said opening, said shutter being selectively movable to substantially close said opening whereby said conductive bar and said delivery member are substantially protected from vaporized metal deposits.

9. A polymerization gun as set forth in claim 7, further comprising:

means for ion cleaning the exterior surfaces of the objects before vapor deposition of metal thereon including:

an elongated inert gas delivery member also supported in said housing having spaced inert gas dispensing apertures and being spaced in close proximity to said conductive bar;

said inert gas delivery member being connectable to an external supply of an inert gas, said conductive bar being positioned between said inert gas delivery member and said opening whereby substantially all of the inert gas being drawn by a vacuum environment into said chamber must first pass through a plasma which energize and accelerate said inert gas to cleaningly strike the exterior surfaces of the objects, said plasma being produced by applying a suitable high electric potential and current between said conductive bar and said chamber.

* * * * *